United States Patent
Hong et al.

(10) Patent No.: US 6,933,755 B2
(45) Date of Patent: Aug. 23, 2005

(54) OUTPUT DRIVING CIRCUIT FOR MAINTAINING I/O SIGNAL DUTY RATIOS

(75) Inventors: Kuk Tae Hong, Gyeonggi-do (KR); Seung Hyun Yi, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/688,607

(22) Filed: Oct. 17, 2003

(65) Prior Publication Data

US 2004/0085114 A1 May 6, 2004

(30) Foreign Application Priority Data

Nov. 4, 2002 (KR) ................................. 10-2002-0067697
Nov. 4, 2002 (KR) ................................. 10-2002-0067696

(51) Int. Cl.$^7$ ................................................ H03K 3/00
(52) U.S. Cl. ....................................... 327/108; 327/333
(58) Field of Search ........................ 327/108–112, 175, 327/333; 326/62–81

(56) References Cited

U.S. PATENT DOCUMENTS 6,262,599 B1 * 7/2001 Coughlin et al. ............. 326/81

* cited by examiner

*Primary Examiner*—Kenneth B. Wells
(74) *Attorney, Agent, or Firm*—Lee, Hong, Degerman, Kang & Schmadeka

(57) ABSTRACT

Output driving circuit including at least one or more than one level shifter for receiving an input signal to be provided to an outside of an integrated circuit and shifting a voltage level of the input signal to a voltage level required at the outside of the integrated circuit while maintaining a duty ratio of the input signal constant, and an output driving unit for forwarding the input signal to the outside of the integrated circuit under the control of an output enable signal, thereby permitting application to the integrated circuit operative at a high speed, readily.

7 Claims, 5 Drawing Sheets

OUTPUT DRIVING CIRCUIT FOR MAINTAINING I/O SIGNAL DUTY RATIOS

This application claims the benefit of the Korean Application Nos. P2002-67696, and P2002-67697, both filed on Nov. 04, 2002, which are hereby incorporated by reference.

BACKGROUND OF THE INVENTION

1. Field of the Invention

The present invention relates to output driving circuits, and more particularly, to an output driving circuit for maintaining duty ratios of input/output signals constant.

2. Background of the Related Art

In general, a core voltage of an integrated circuit differs from an I/O voltage outside of the integrated circuit. Owing to development of technology for reducing power consumption, when the core voltage drops gradually, the outside (PCB board) power of the integrated circuit is maintained without any change. Therefore, for providing a core voltage signal to an outside of the integrated circuit, the output driving circuit is required for shifting a level of the core voltage to a voltage level outside of the integrated circuit.

The output driving circuit in general is provided with a level shifter for shifting the voltage level. However, if the level shifter shifts the voltage level of an input signal to the voltage level required at the outside of the integrated circuit, the duty ratio of the shifted signal is changed, along with the voltage level. There has been a problem in that the level shifter can not be used for an integrated circuit operative at a fast speed.

The problem of the related art will be described in more detail, with reference to the attached drawings. FIG. 1 illustrates a block diagram showing a related art output driving circuit.

Referring to FIG. 1, the related art output driving circuit is provided with a first level shifter 100 for receiving an input signal to be provided to an outside of an integrated circuit and shifting a voltage level of the input signal to a voltage level required at the outside of the integrated circuit, a second level shifter 110 for receiving an output enable signal, and shifting a voltage level of the output enable signal to a voltage level required at the outside of the integrated circuit, and an output driving unit 500 for forwarding the input signal having the voltage level shifted under the control of the output enable signal from the second level shifter 110 to the outside of the integrated circuit. The operation of the output driving circuit will be described.

The first level shifter 100 receives the input signal to be provided to the outside of the integrated circuit, and shifts the voltage level of the input signal to the voltage level required at the outside of the integrated circuit. The voltage level of the input signal generated at the integrated circuit is lower than the voltage level required at the outside of the integrated circuit. The second level shifter 110 receives an output enable signal, and shifts the voltage level of the output enable signal to the voltage level required at the outside of the integrated circuit.

The output driving unit 500 forwards the input signal having the voltage level shifted under the control of the output enable signal from the second level shifter 110 to the outside of the integrated circuit.

FIG. 2 illustrates a circuit diagram of the related art first or second level shifter.

Referring to FIG. 2, the first or second level shifter 100 or 110 is provided with a plurality of inverters INV1, and INV2 for receiving, inverting, and delaying a signal in succession, a sense amplifier 200 for amplifying the inverted and delayed signal, and a plurality of inverters INV3 and INV4 for inverting, and delaying the amplified signal in succession, and providing to the driving unit 500.

The sense amplifier 200, of a mirror type, is provided with a PMOS transistor PM1 and an NMOS transistor NM1, and a PMOS transistor PM2 and an NMOS transistor NM2 connected in series respectively between a power terminal VDD the voltage level the outside of the integrated circuit requires applied thereto, and ground.

The PMOS transistor PM1 has a gate connected to a connecting point of the PMOS transistor PM2 and the NMOS transistor NM2, and the PMOS transistor PM2 has a gate connected to a connecting point of the PMOS transistor PM1 and the NMOS transistor NM1. In this instance, the connecting point of the PMOS transistor PM2 and the NMOS transistor NM2 is an output terminal of the sense amplifier 200.

The NMOS transistor NM1 has a gate connected to receive the signal or the output enable signal through the inverters INV1 and INV2, and the NMOS transistor NM2 has a gate connected to receive the signal or the output enable signal through the inverter INV1.

The operation of the related art first or second level shifter 100 or 110 will be described.

The inverter INV1 inverts the input signal to be forwarded to the outside of the integrated circuit, or the output enable signal (for convenience of description, will be called as an input signal), and provides to the gate of the NMOS transistor NM2. Along with this, the inverter INV2 inverts the inverted input signal, and provides to the gate of the NMOS transistor NM1.

Then, since the NMOS transistor NM1, or the NM2 is turned on selectively, to turn on the PMOS transistor PM1 or PM2 selectively accordingly, the voltage level of the power terminal VDD is provided to the connecting point of the NMOS transistor NM2 and the PMOS transistor PM2. That is, an output signal of a voltage level required at the outside of the integrated circuit is generated at the connecting point of the NMOS transistor NM2 and the PMOS transistor PM2. Then, the inverter INV3 and INV4 delay the output signal, and provides to the driving unit 500.

For an example, when the input signal has a high level voltage, since the NMOS transistor NM1 and the PMOS transistor PM2 are turned on, and the NMOS transistor NM2 and the PMOS transistor PM1 are turned off, the high level voltage from the power terminal VDD is provided through the PMOS transistor PM2. Then, the high level voltage is provided to the driving unit 500 through the inverters INV3 and INV4.

Opposite to this, if the input signal has a low level voltage, since the NMOS transistor NM1 and the PMOS transistor PM2 are turned off, and the NMOS transistor NM2 and the PMOS transistor PM1 are turned on, ground level voltage is provided through the PMOS transistor PM2. Then, the ground level voltage is provided to the driving unit 500 through the inverters INV3 and INV4.

In such a related art first or second level shifter 100 or 110, because the input signal is inverted and delayed through the inverter INV1 and provided to the gate of the NMOS transistor NM2, and inverted and delayed through the inverter INV2 again and provided to the gate of the NMOS transistor INV1, the signals provided to the gate of the NMOS transistors NM1 and NM2 have different delay time periods.

Moreover, in the first or second level shifter 100 or 110, since, when the input signal has the high level voltage, the PMOS transistor PM2 is turned on to provide the power from the power terminal VDD which is a high level voltage through the PMOS transistor PM2, and when the input signal is low level voltage, the NMOS transistor NM2 is turned on to provide the ground level voltage which is the low level voltage through the NMOS transistor NM2, generating paths of the high level voltage and the low level voltage in the sense amplifier 200, being the PMOS transistor PM2 and the NMOS transistor NM2, differ from each other, and operation delay time periods of the PMOS transistor PM2 and the NMOS transistor NM2 also differ from each other.

Thus, in the first and second level shifter 100 and 110, the delay time periods of the two signals provided to the two input terminals of the sense amplifier 200 differ from each other, and delay time periods required for providing the high level voltage and the low level voltage in response to the two signals differ from each other. Therefore, when a voltage level of a signal is shifted and provided to the outside of the integrated circuit, since the duty ratio of the signal also changes, there has been a problem in that the first and second level shifter 100 and 110 can not be used in the integrated circuit operative at a fast speed.

That is, the duty ratio of a pulse signal processed in the integrated circuit is 50:50, and a cyclic period of the pulse signal is 5 ns, a high level time period and a low level time period of the pulse signal are 2.5 ns, respectively. In a case a voltage level of such a pulse signal is shifted according to the related art output driving circuit, due to a difference of the delay time period of the first and second level shifters 100 and 110, if the high level time periods of the pulse signals respectively provided to the first and second level shifters 100, and 110 differ in a range of 1 ns, the high level time period and the low level time period of the pulse signals respectively provided from the first and second level shifters 100 differ in ranges of 1.5 ns and 3.5 ns respectively, which can not be used in an integrated circuit operative at a fast speed.

SUMMARY OF THE INVENTION

Accordingly, the present invention is directed to an output driving circuit that substantially obviates one or more of the problems due to limitations and disadvantages of the related art.

An object of the present invention is to provide an output driving circuit which can maintain duty ratios of input/output signals constant.

Another object of the present invention is to provide an output driving circuit which can shift an input signal to a voltage level required at an outside of an integrated circuit.

Additional features and advantages of the invention will be set forth in the description which follows, and in part will be apparent to those having ordinary skill in the art upon examination of the following or may be learned from practice of the invention. The objectives and other advantages of the invention will be realized and attained by the structure particularly pointed out in the written description and claims hereof as well as the appended drawings.

To achieve these objects and other advantages and in accordance with the purpose of the present invention, as embodied and broadly described herein, the output driving circuit includes a first level shifter for receiving an input signal to be provided to an outside of an integrated circuit and shifting a voltage level of the input signal to a voltage level required at the outside of the integrated circuit while maintaining a duty ratio of the input signal constant, a second level shifter for receiving an output enable signal, and shifting a voltage level of the output enable signal to a voltage level required at the outside of the integrated circuit while maintaining a duty ratio of the output enable signal constant, and an output driving unit for forwarding the input signal to the outside of the integrated circuit under the control of the output enable signal from the second level shifter.

The output driving unit includes an NAND gate for receiving for receiving signals from the first level shifter and the second level shifter, subjecting to NAND operation, and providing to a gate of the PMOS transistor, an NOR gate for receiving signals from the first level shifter and the second level shifter, subjecting to NOR operation, and providing to a gate of the NMOS transistor, a ninth inverter for receiving, inverting, and providing a signal from the second level shifter to the NAND gate, and a seventh PMOS transistor and a seventh NMOS transistor connected in series between the power terminal and ground.

The first or second level shifter includes an input signal splitting unit for providing the input signal in two signals having the same delay time periods, a sense amplifier for amplifying voltage levels of the two signals into a voltage level required at the outside of the integrated circuit, and a delay compensating unit for making delay time periods of the two signals amplified at the sense amplifier to be the same, and forwarding the two signals, selectively.

The input signal splitting unit includes first and second inverters for delaying the input signal for a preset time period and providing to one side input terminal of the sense amplifier, and a first transmission gate for delaying a signal from the first inverter for a time period the same with a delay time period at the second inverter, and providing to the other side input terminal of the sense amplifier.

The sense amplifier includes a first PMOS transistor and a first NMOS transistor, and a second PMOS transistor and a second NMOS transistor, respectively connected in series between a power terminal the voltage level required at the outside of the integrated circuit is applied thereto and ground, for providing the voltage level of the power terminal and the voltage level of the ground, selectively.

The delay compensating unit includes a third PMOS transistor and a third NMOS transistor connected in series between the power terminal the voltage level required at the outside of the integrated circuit is applied thereto and ground, for providing the voltage level of the power terminal, and the voltage level of the ground, selectively.

Alternatively, the first or second level shifter includes a seventh inverter for inverting the input signal, a third transmission gate for delaying the input signal for a time period the same as the seventh inverter, and passing the delayed input signal, third and fourth level shifters each for shifting a voltage level of a signal from the seventh inverter or the third transmission gate to a voltage level at the power terminal, first and second pulse signal generating units each for generating a pulse signal at a rising edge of a signal from the third or fourth level shifter, and an output signal generating unit for delaying signals from the first and second pulse signal generating units for the same time periods, and generating signals having a high level voltage and a low level voltage shifted in response to the pulse signals generated at the first and second pulse signal generating units.

It is to be understood that both the foregoing description and the following detailed description of the present invention are exemplary and explanatory and are intended to provide further explanation of the invention claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Reference will now be made in detail to the preferred embodiments of the present invention, examples of which are illustrated in the accompanying drawings. Parts the same with the related art will be given the same names and reference symbols, and description of which will be omitted.

Alike the related art, an input signal to be provided to an outside of the integrated circuit is provided to a first level shifter 100, and an output enable signal is provided to a second level shifter 110.

1) First Embodiment

Figure 1:
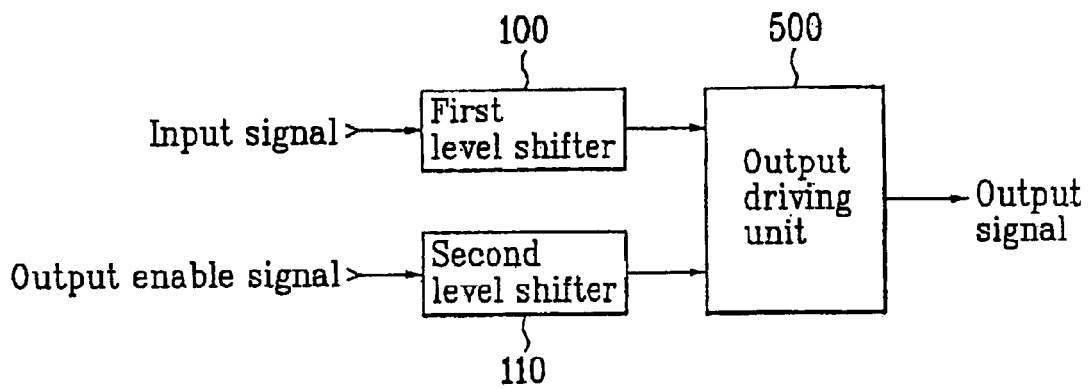
FIG. 1 illustrates a block diagram of a related art output driving circuit.
Figure 2:
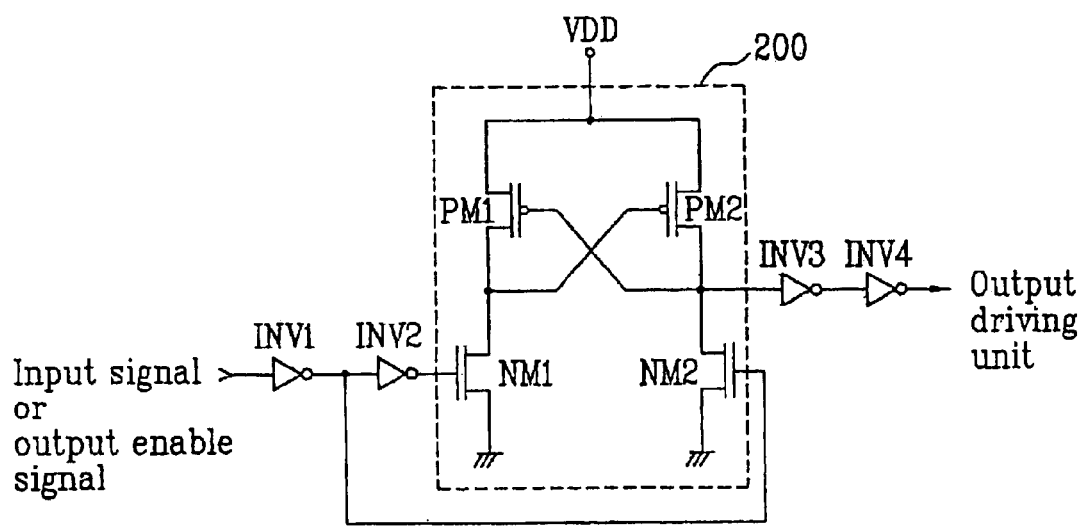
FIG. 2 illustrates a circuit diagram of the related art first or second level shifter.
Figure 3:
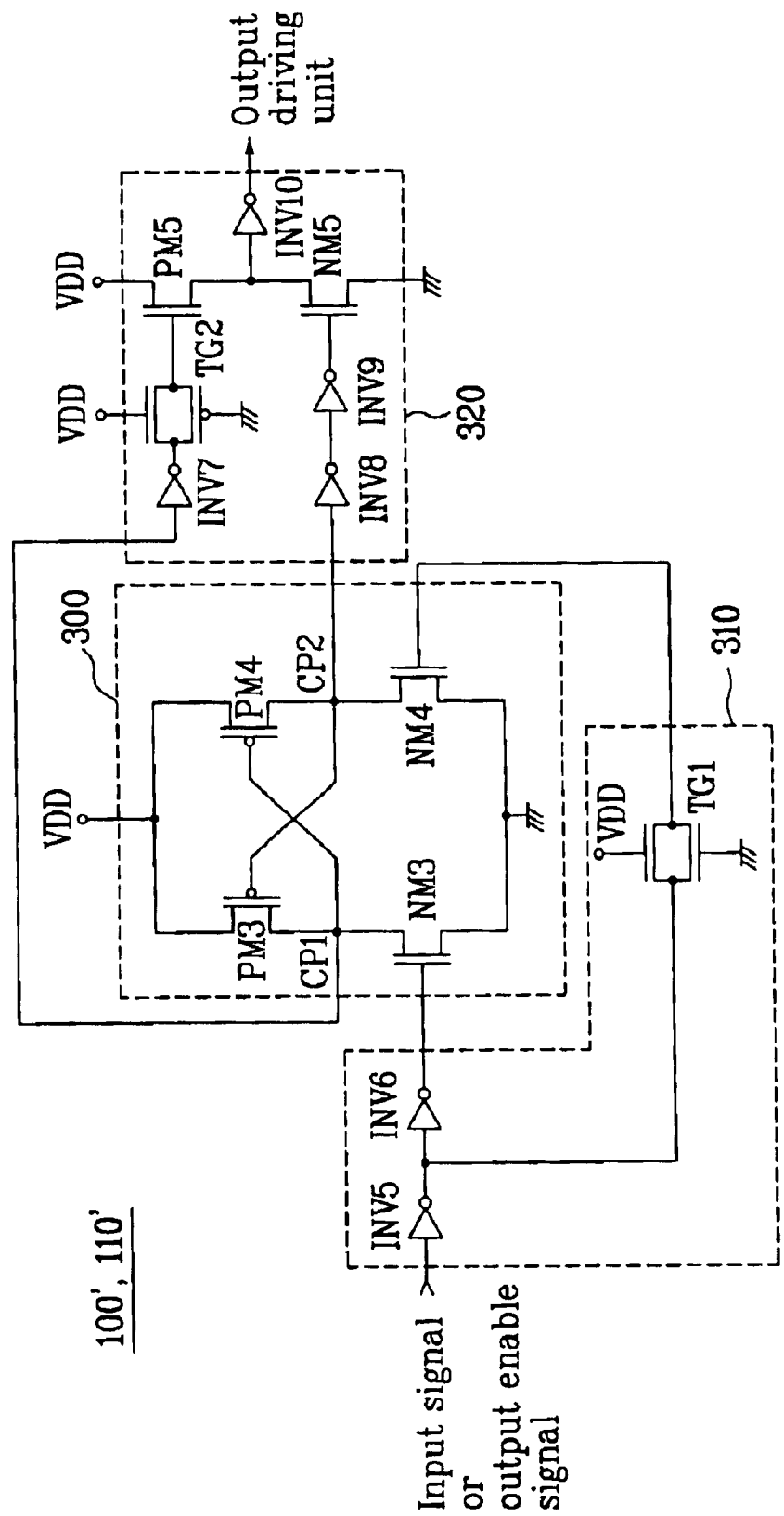
FIG. 3 illustrates a circuit diagram of a level shifter in accordance with a first preferred embodiment of the present invention.

FIG. 3 illustrates a circuit diagram of a level shifter in accordance with a first preferred embodiment of the present invention.

Referring to FIG. 3, the level shifter 100' or 110' includes an input signal splitting unit 310 for maintaining a delay time period of a received signal constant, a sense amplifier 300 for amplifying the delayed signal, and a delay compensating unit 320.

The input signal splitting unit 310 includes a plurality of inverters INV5, and INV6, and a transmission gate TG1, wherein the input signal passes through, and is delayed at, the plurality of inverters INV5 and INV6 in succession for a time period, and is provided to the input terminal at one side of the sense amplifier 300, and an output signal from the inverter INV5 is delayed at the transmission gate TG1 for a time period the same with a delay time period at the inverter INV6, and provided to the other side input terminal of the sense amplifier 300.

The sense amplifier 300, of a mirror type, includes a PMOS transistor PM3 and an NMOS transistor NM3, and a PMOS transistor PM4 and an NMOS transistor NM4 connected in series respectively between a power terminal VDD the voltage level the outside of the integrated circuit requires applied thereto, and ground.

The gate of the NMOS transistor NM3 connected to the inverter INV6 serves as a first input terminal of the sense amplifier 300, and the gate of the NMOS transistor NM4 connected to the transmission gate TG1 serves as a second input terminal of the sense amplifier 300.

The gate of the PMOS transistor PM4 connected to a connecting point of the PMOS transistor PM3 and the NMOS transistor NM3 serves as a first output terminal CP1 of the sense amplifier 300, and the gate of the PMOS transistor PM3 connected to a connecting point of the PMOS transistor PM4 and the NMOS transistor NM4 serves as a second output terminal CP2 of the sense amplifier 300.

The delay compensating unit 320 includes a plurality of inverters INV7, INV8, INV9, and INV10, a transmission gate TG2, a PMOS transistor PM5, and an NMOS transistor NM5. That is, between a power terminal VDD a voltage level required at the outside of the integrated circuit is provided therefrom and ground, the PMOS transistor PM5 and the NMOS transistor NM5 are connected in series. The first output terminal CP1 of the sense amplifier 300 is connected to the gate of the PMOS transistor PM5 through the inverter INV7 and the transmission gate TG2, and the second output terminal CP2 of the sense amplifier 300 is connected to the gate of the NMOS transistor NM5 through the inverters INV8 and INV9.

The connecting point of the PMOS transistor PM5 and the NMOS transistor NM5 is connected to the output driving unit 500' through the inverter INV10.

The operation of the level shifter 100' or 110' of the present invention will be described.

The inverter INV5 inverts the input signal to be provided to the outside of the integrated circuit or the output enable signal (for convenience of description, will be call as 'input signal'), and provides the input signal to the gate of the NMOS transistor NM4 through the transmission gate TG1. Along with this, the inverter INV6 inverts the inverted input signal again, and provides to the gate of the NMOS transistor NM3.

In the sense amplifier 300, since the NMOS transistors NM3 and NM4 are turned on selectively depending on signals provided to the first input terminal and the second input terminal, and to turn on the PMOS transistors PM3 and PM4 selectively accordingly, the voltage level of the power terminal VDD is selectively applied to the connecting points of the NMOS transistors NM3 and NM4, and the PMOS transistors PM3 and PM4, respectively. That is, an output signal of the voltage level required at the outside of the integrated circuit is selectively provided to the first output terminal CP1 and the second output terminal CP2, respectively.

For an example, when the input signal has a high level voltage, since the high level voltage is provided to the NMOS transistor NM3, to turn on the NMOS transistor NM3 and the PMOS transistor PM4, and turn off the NMOS transistor NM4 and the PMOS transistor PM3, the high level voltage of the power terminal VDD is provided to the second output terminal CP2 through the PMOS transistor PM4.

Opposite to this, if the input signal has a low voltage level, since the NMOS transistor NM3 and the PMOS transistor PM4 are turned off, and the high level voltage is provided to the NMOS transistor NM4 to turn on the NMOS transistor NM4 and the PMOS transistor PM3, the voltage level of the power terminal VDD is provided to the first output terminal CP1 through the PMOS transistor PM3.

The delay compensating unit 320 inverts and delays the signal from the first output terminal CP1 through the inverter INV7 and the transmission gate TG2, and provides to the gate of the PMOS transistor PM5, and inverts the signal from the second output terminal CP2 through the inverter INV8 and the INV9, and provides to the gate of the NMOS transistor NM5.

Then, depending on the signals from the first output terminal CP1 and the second output terminal CP2, the PMOS transistor PM5 and the NMOS transistor NM5 are turned on selectively. Then, the inverter INV10, connected to the connecting point of the PMOS transistor PM5 and the NMOS transistor NM5, inverts the high level voltage and the low level voltage depending on ON/OFF state of the PMOS transistor PM5 and the NMOS transistor NM5, and provides to the output driving unit 500'.

Delay time periods of the elements will be discussed.

When the input signal is split into two parts and provided to the first input terminal and the second input terminal of the sense amplifier 300, since the delay time periods at the input signal splitting unit 310 and the transmission gate TG2 are the same, the two signals provided to the first input terminal and the second input terminal of the sense amplifier 300 have the same delay time periods, even if polarities of the two signals are opposite.

Moreover, since the PMOS transistors PM3 and PM4 are turned on selectively depending on the two signals provided to the first input terminal and the second input terminal of the sense amplifier 300, to provide the power of the power terminal VDD to the first output terminal CP1 and the second output terminal CP2 of the sense amplifier 300 through the PMOS transistors PM3 and PM4, the delay time periods are also the same.

Furthermore, since the two signals from the first output terminal CP1 and the second output terminal CP2 of the sense amplifier 300 are provided to the PMOS transistor PM5 and the NMOS transistor NM5 through the inverter INV7, the transmission gate TG2, and the inverters INV8 and INV9 in the delay compensating unit 320, the delay time periods of the two signals provided to the gate of the PMOS transistor PM5 and the gate of the NMOS transistor NM5 are the same.

Eventually, the level shifters 100' or 110' of the present invention provides the input signal to the output driving unit 500' after making a duty ratio of the input signal the same with the output signal perfectly, and only shifting the voltage level of the input signal to the voltage level of the power terminal VDD.

2) Second Embodiment

Figure 4:
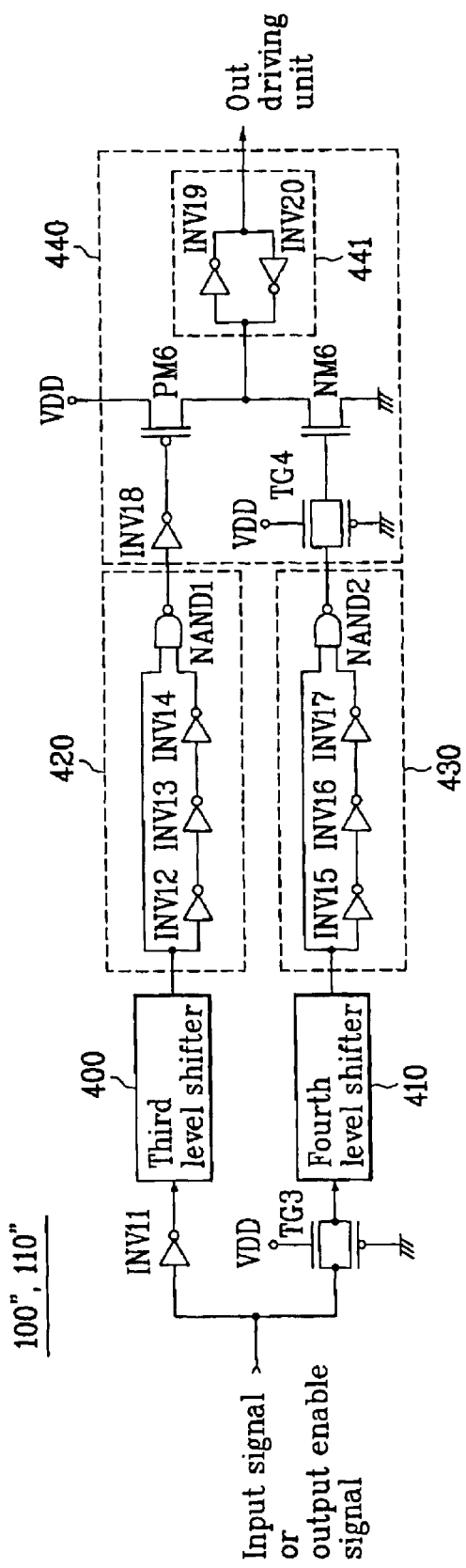
FIG. 4 illustrates a circuit diagram of a level shifter in accordance with a second preferred embodiment of the present invention.

FIG. 4 illustrates a circuit diagram of a level shifter in accordance with a second preferred embodiment of the present invention.

Referring to FIG. 4, the level shifter 100" or 110" includes an inverter INV11, a transmission gate TG3, third and fourth level shifters 400 and 410 each for boosting a voltage level of a signal from the inverter INV11 or the transmission gate TG3 to a voltage level of a power terminal VDD, first and second pulse signal generating units 420 and 430 each for generating a pulse signal at a rising edge of the signal from the third or the fourth level shifter 400 or 410, and an output signal generating unit 440 for delaying the signals from the first and second pulse signal generating units 420 and 430 for the same time periods, and generating a signal having a high level voltage and a low level voltage shifted according to the pulse signals the first and second pulse signal generating parts 420 and 430 generate respectively.

The third and fourth level shifters 400 and 410 have the same system and operation with the related art level shifters 100 and 110.

The first or second pulse signal generating unit 420 or 430 includes a plurality of inverters INV12, INV13, and INV14, or INV15, INV16, and INV17 for inverting and delaying the signal from the third or fourth level shifter 400 or 410 in succession, and an NAND gate NAND 1, or NAND 2 for subjecting a signal from the third or fourth level shifters 400 or 410 and a signal from the plurality of inverters INV12, INV13, and INV 14, or INV 15, INV16, and INV17 to NAND operation.

The output signal generating unit 440 includes an inverter INV18, a transmission gate TG4, a PMOS transistor PM6, an NMOS transistor NM6, and a latch 441. That is, the PMOS transistor PM6 and the NMOS transistor NM6 are connected in series between the power terminal VDD and ground. An output terminal of the first pulse signal generating unit 420 is connected to a gate of the PMOS transistor PM6, and an output terminal of the second pulse signal generating unit 430 is connected to a gate of the NMOS transistor NM6 through the transmission gate TG4. The latch 441 having inverters INV19 and INV20 is connected to a connecting point of the PMOS transistor PM6 and the NMOS transistor NM6.

The operation of the level shifter 100" or 110" in accordance with a second preferred embodiment of the present invention will be described with reference to the attached FIGS. 5A~5J.

Figure 5:
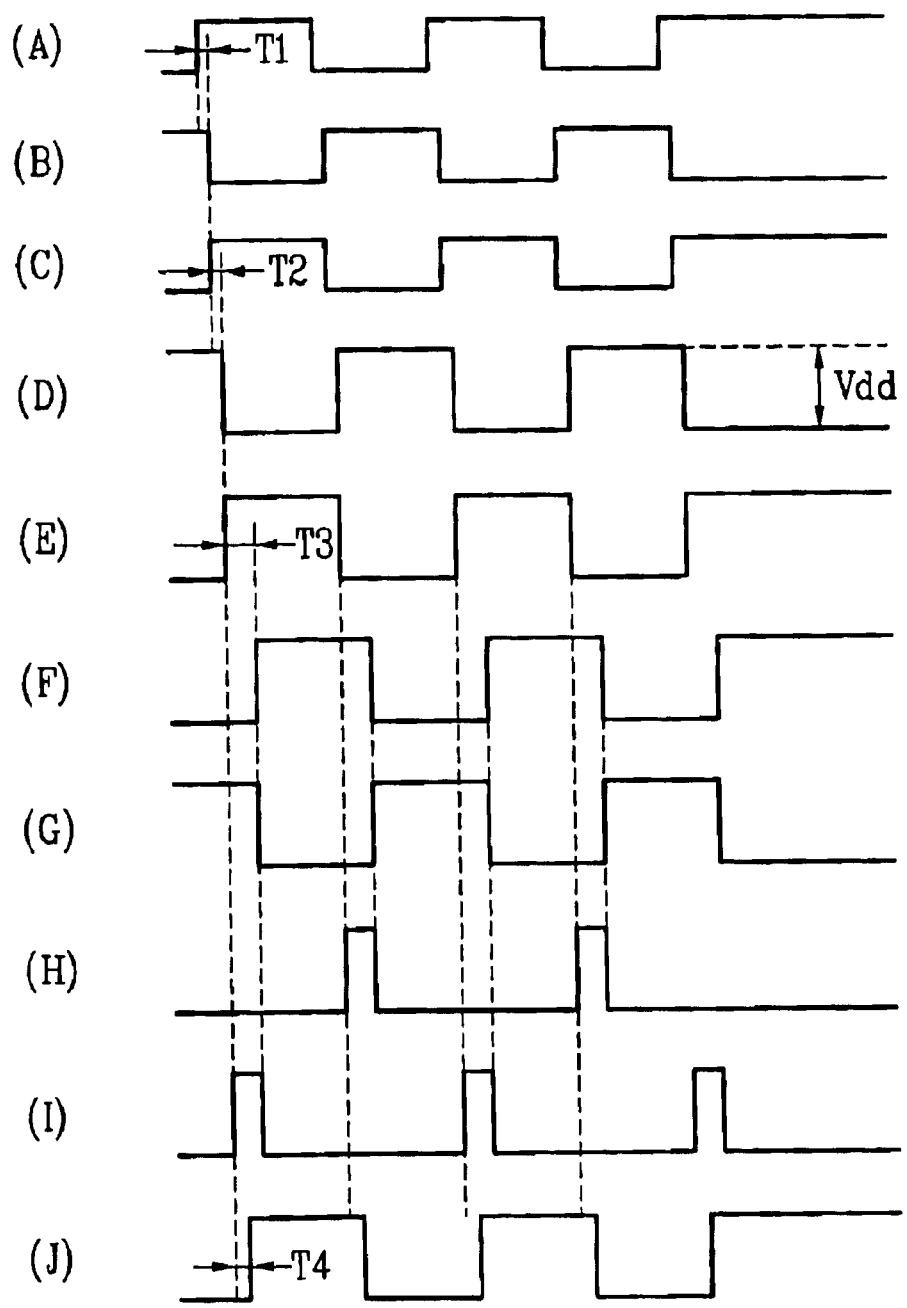
FIGS. 5A~5J illustrate waveforms for describing operation of the level shifter in accordance with a second preferred embodiment of the present invention.

If the input signal as shown in FIG. 5A is provided in a state a power is provided to the power terminal VDD, the input signal is inverted and delayed for a preset time period T1 through the inverter INV11 as shown in FIG. 5B, and provided to the third level shifter 400. Also, as shown in FIG. 5C, the input signal is delayed as long as the delay time period T1 of the inverter INV11 through the transmission gate TG3 and provided to the fourth level shifter 410.

Then, as shown in FIG. 5D or 5E, the third or fourth level shifter 400 or 410 shifts the voltage level of the signal from the inverter INV11 or the transmission gate TG3 to the voltage level of the power terminal VDD. In this instance, alike the related art, while shifting the voltage level of the input signal, the third and fourth level shifters 400 and 410 delay the input signal for a preset time period T2, respectively.

The level shifted signal is provided to an input terminal of one side of the NAND gate NAND1 or NAND 2 in the first or second pulse signal generating part 420 or 430, and, as shown in FIGS. 5F and 5G, delayed for a preset time period T3 through the plurality of inverters INV12, INV13, and INV 14, or INV 15, INV16, and INV17, and provided to an input terminal on the other side of the NAND gate NAND1 or NAND2. Then, the NAND gate NAND1 or NAND 2 receives the delayed signal, and, as shown in FIG. 5H or 5I, generates a pulse signal having a width corresponding to the delay time period T3 of the plurality of inverters INV12, INV13, and INV 14, or INV 15, INV16, and INV17.

Then, the pulse signal generated at the first pulse signal generating unit 420 is delayed for a preset time period T4 through the inverter INV18 in the output signal generating unit 440, and provided to the gate of the PMOS transistor PM6, to turn on the PMOS transistor PM6, according to which a voltage of the power terminal VDD is provided through the PMOS transistor PM6.

In the meantime, the pulse signal generated at the second pulse signal generating unit 430 is delayed through the transmission gate TG4 in the output signal generating unit 440 for a time period the same with the delay time period T4 at the inverter INV18, and provided to the gate of the NMOS transistor NM6 to turn on the NMOS transistor NM6, according to which a ground voltage is provided through the NMOS transistor NM6. A signal provided in this instance is as shown in FIG. 5J.

The level shifter 100" or 110" in accordance with the second preferred embodiment of the present invention can provide an input signal having a duty ratio the same with the output signal and a voltage level shifted to a voltage level of a power terminal VDD, by inverting the input signal to be provided to the outside of the integrated circuit, respectively shifting voltage levels of the input signal and the inverted input signal to the voltage level required at the outside of the integrated circuit, and generating pulse signals having preset widths at rising edges or falling edges of the two signals having the voltage level thereof shifted as an output signal.

The level shifters 100' and 110', or 100" and 110" (for convenience of description only 100' and 110' will be referred to) in accordance with the first or second preferred embodiment of the present invention shift the voltage level of the input signal to the voltage level of the power terminal, and provide to the respective output driving units 500', respectively.

Figure 6:
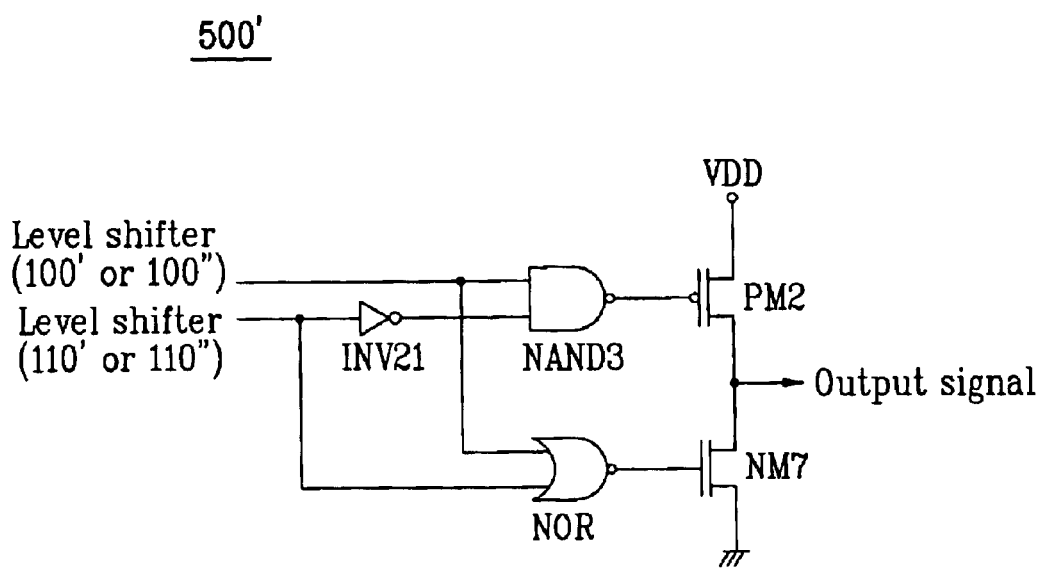
FIG. 6 illustrates a circuit of an output driving unit in accordance with a preferred embodiment of the present invention.

FIG. 6 illustrates a circuit of an output driving unit in accordance with a preferred embodiment of the present invention.

Referring to FIG. 6, the output driving unit 500' includes an NAND gate NAND3, an NOR gate NOR, an inverter INV21, and a PMOS transistor PM7 and an NMOS transistor NM7 connected in series between a power terminal VDD and ground.

The NAND gate NAND3 receives signals from the level shifters 100' and 110', subjects to NAND operation, and provides to a gate of the PMOS transistor PM7. In this instance, the signal from the level shifter 110' is inverted at the inverter INV21 and provided to the NAND gate NAND3. The NOR gate NOR receives the signals from the level shifters 100' and 110', subjects to NOR operation, and provides to a gate of the NMOS transistor NM7.

Then, the input signal having the voltage level shifted is provided from the connecting point of the PMOS transistor PM7 and the NMOS transistor NM7 to the outside of the integrated circuit.

The operation of the output driving unit 500' will be described.

In a case the output enable signal from the level shifter 110' has a high level voltage, the high level voltage is provided to the other side input terminal of the NOR gate NOR, as well as inverted to a low level voltage through the inverter INV21 and provided to the other side input terminal of the NAND gate NAND3, such that the NAND gate NAND3 always provides a signal only in the high level voltage, and the NOR gate NOR provides a signal only in the low level voltage regardless of the high/low voltage of the signal from the level shifter 110, to turn off both the PMOS transistor PM7 and the NMOS transistor NM7, thereby providing no signal therefrom.

However, when the output enable signal from the level shifter 110' has the low level voltage, since the low level voltage is provided to the other side input terminal of the NOR gate NOR as well as inverted to a high level voltage through the inverter INV21 and provided to the other side input terminal of the NAND gate NAND3, a voltage of the power terminal VDD or a ground voltage is provided to the outside of the integrated circuit depending on an output from the level shifter 100'.

That is, in a case the high level voltage is received from the level shifter 100', both the NAND gate NAND3 and the NOR gate NOR provide the low level voltages, to turn on the PMOS transistor PM7 and turn off the NMOS transistor NM7, thereby providing the voltage of the power terminal VDD to the outside of the integrated circuit through the PMOS transistor PM7.

In a case the low level voltage is received from the level shifter 100', opposite to the case of the high level voltage, both the NAND gate NAND3 and the NOR gate NOR provide high level voltages, to turn off the PMOS transistor PM7 and to turn on the NMOS transistor NM7, thereby providing the low level voltage, the ground voltage, to the outside of the integrated circuit through the NMOS transistor NM7.

Thus, the output driving circuit of the present invention can be applied to an integrated circuit operative at a high speed readily, since an input signal and an output signal have the same duty ratio, and only a voltage level of the input signal is shifted to a voltage level an outside of the integrated circuit requires for.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An output driving circuit comprising:
    a first level shifter for receiving an input signal to be provided to an outside of an integrated circuit and shifting a voltage level of the input signal to a voltage level required at the outside of the integrated circuit while maintaining a duty ratio of the output signal constant;
    a second level shifter for receiving an output enable signal, and shifting a voltage level of the output enable signal to a voltage level required at the outside of the integrated circuit while maintaining a duty ratio of the output enable signal constant; and
    an output driving unit for forwarding the output signal to the outside of the integrated circuit under the control of the output enable signal from the second level shifter,
    wherein the first or second level shifter comprises:
    an input signal splitting unit for providing the input signal in two signals having the same delay time periods;
    a sense amplifier for amplifying voltage levels of the two signals into a voltage level required at the outside of the integrated circuit; and
    a delay compensating unit for making delay time periods of the two signals amplified at the sense amplifier to be the same, and forwarding the two signals, selectively, and
    wherein the input signal slitting unit comprises:
    first and second inverters for delaying the input signal for a preset time period and providing to one side input terminal of the sense amplifier, and
    a first transmission gate for delaying a signal from the first inverter for a time period the same with a delay time period at the second inverter, and providing to the other side input terminal of the sense amplifier.

2. The output driving circuit as claimed in claim 1, wherein the sense amplifier comprises a first PMOS transistor and a first NMOS transistor, and a second PMOS transistor and a second NMOS transistor, respectively connected in series between a power terminal the voltage level required at the outside of the integrated circuit is applied thereto and ground, for providing the voltage level of the power terminal and the voltage level of the ground, selectively.

3. The output driving circuit as claimed in claim 2, wherein the first NMOS transistor comprises a gate connected to a second inverter, and serves as a first input terminal, and the second NMOS transistor comprises a gate connected to the first transmission gate in the input signal splitting unit, and serves as a second input terminal.

4. The output driving circuit as claimed in claim 2, wherein the first PMOS transistor includes a gate connected to a connecting point of the second PMOS transistor and the second PMOS transistor, and the connecting point serving as the first output terminal of the sense amplifier, and the second PMOS transistor includes a gate connected to a connecting point of the first PMOS transistor and a first NMOS transistor, the connecting point serving as the second output terminal.

5. The output driving circuit as claimed in claim 1, wherein the delay compensating unit comprises a PMOS transistor and a NMOS transistor connected in series between the power terminal the voltage level required at the outside of the integrated circuit is applied thereto and ground, for providing the voltage level of the power terminal, and the voltage level of the ground, selectively.

6. The output driving circuit as claimed in claim 5, wherein the third PMOS transistor includes a gate connected to the first output terminal of the sense amplifier through a third inverter and a second transmission gate, the NMOS transistor includes a gate connected to the second output terminal of the sense amplifier through fourth and fifth inverters in succession, and a connecting point of the PMOS transistor and the NMOS transistor connected to the output driving unit through the sixth inverter.

7. The output driving circuit as claimed in claim 1, wherein the output driving unit includes;

an NAND gate for receiving for receiving signals from the first level shifter and the second level shifter, subjecting to NAND operation, and providing to a gate of the PMOS transistor, an NOR gate for receiving signals from the first level shifter and the second level shifter, subjecting to NOR operation, and providing to a gate of the NMOS transistor, a ninth inverter for receiving, inverting, and providing a signal from the second level shifter to the NAND gate, and a seventh PMOS transistor and a seventh NMOS transistor connected in series between the power terminal and ground.

* * * * *